(12) United States Patent
Endo (10) Patent No.: US 11,778,799 B2
(45) Date of Patent: Oct. 3, 2023

(54) TAPE FEEDER SUPPORT PLATE TYPE/COMPONENT TYPE COMBINATION VERIFICATION SYSTEM AND SUPPORT PLATE TYPE/COMPONENT TYPE COMBINATION VERIFICATION METHOD

(71) Applicant: FUJI CORPORATION, Chiryu (JP)

(72) Inventor: Yamato Endo, Kosai (JP)

(73) Assignee: FUJI CORPORATION, Chiryu (JP)

( * ) Notice: Subject to any disclaimer, the term of this patent is extended or adjusted under 35 U.S.C. 154(b) by 695 days.

(21) Appl. No.: 16/967,536

(22) PCT Filed: Feb. 20, 2018

(86) PCT No.: PCT/JP2018/005842
§ 371 (c)(1),
(2) Date: Aug. 5, 2020

(87) PCT Pub. No.: WO2019/162984
PCT Pub. Date: Aug. 29, 2019

(65) Prior Publication Data
US 2021/0153403 A1 May 20, 2021

(51) Int. Cl.
*H05K 13/02* (2006.01)
*H05K 13/04* (2006.01)
(Continued)

(52) U.S. Cl.
CPC ....... *H05K 13/0812* (2018.08); *G05B 19/402* (2013.01); *H05K 13/0419* (2018.08);
(Continued)

(58) Field of Classification Search
None
See application file for complete search history.

(56) References Cited

U.S. PATENT DOCUMENTS 6,157,870 A * 12/2000 Gfeller ............... B23P 19/001
221/73
6,778,878 B1 * 8/2004 Kou .................. H05K 13/0417
700/95
(Continued)

FOREIGN PATENT DOCUMENTS

JP 11-40985 A 2/1999
JP 200719297 A * 1/2007 ............. H05K 13/04
(Continued)

OTHER PUBLICATIONS

International Search Report dated May 5, 2018 in PCT/JP2018/005842 filed on Feb. 20, 2018, 2 pages.

*Primary Examiner* — Mohammad Ali
*Assistant Examiner* — Kelvin Booker
(74) *Attorney, Agent, or Firm* — Oblon, McClelland, Maier & Neustadt, L.L.P.

(57) ABSTRACT

A support plate, which is configured to support a component supply tape, is provided on a bottom face section of a tape passage, through which the component supply tape passes, of a tape feeder. A computer acquires information on a type of the support plate provided in the tape feeder and also acquires information on a type of components of the component supply tape. Further, the computer determines the appropriateness of a combination of the type of the support plate and the type of the components of the component supply tape so acquired by referring to a database accumulating therein data on appropriate combinations of types of support plates and types of components of component supply tapes and outputs a message corresponding to a determination result of the appropriateness of the combination to at least one of a display device, an audio device, and a mobile terminal.

9 Claims, 6 Drawing Sheets

(51) Int. Cl.
    *H05K 13/08*     (2006.01)
    *G05B 19/40*     (2006.01)
    *G05B 19/402*     (2006.01)

(52) U.S. Cl.
    CPC ........... *H05K 13/083* (2018.08); *H05K 13/02* (2013.01); *H05K 13/04* (2013.01)

(56) References Cited

U.S. PATENT DOCUMENTS

| | | | |
|---|---|---|---|
| 6,817,216 B2 * | 11/2004 | Kou | H05K 13/0215 70/225 |
| 6,879,869 B2 * | 4/2005 | Kou | H05K 13/0882 700/117 |
| 8,269,973 B2 * | 9/2012 | Kou | H05K 13/0417 356/445 |
| 9,736,970 B2 * | 8/2017 | Kanda | H05K 13/0417 |
| 2004/0039480 A1 * | 2/2004 | Kou | H05K 13/0215 700/222 |
| 2006/0207089 A1 * | 9/2006 | Maenishi | H05K 13/084 700/114 |
| 2009/0225304 A1 * | 9/2009 | Hiyoshi | H05K 13/0812 702/166 |
| 2015/0047788 A1 | 2/2015 | Kanda et al. | |
| 2016/0345441 A1 * | 11/2016 | Kou | H05K 13/0417 |
| 2018/0042151 A1 * | 2/2018 | Ohashi | H05K 13/02 |

FOREIGN PATENT DOCUMENTS

| | | | |
|---|---|---|---|
| JP | 2007-27246 A | 2/2007 | |
| JP | 4453617 B2 * | 4/2010 | ............ H05K 13/04 |
| JP | 2014-241344 A | 12/2014 | |
| JP | 2015141909 A * | 8/2015 | ............ H05K 13/02 |
| JP | 2015141910 A * | 8/2015 | ............ H05K 13/02 |
| JP | 2016-81956 A | 5/2016 | |
| JP | 6097937 B2 * | 3/2017 | ............ H05K 13/02 |
| JP | 6097938 B2 * | 3/2017 | ............ H05K 13/02 |
| WO | WO 2013/132599 A1 | 9/2013 | |
| WO | WO 2017/109892 A1 | 6/2017 | |
| WO | WO-2018/087848 A1 * | 5/2018 | ............ H05K 13/02 |

\* cited by examiner

TAPE FEEDER SUPPORT PLATE TYPE/COMPONENT TYPE COMBINATION VERIFICATION SYSTEM AND SUPPORT PLATE TYPE/COMPONENT TYPE COMBINATION VERIFICATION METHOD

TECHNICAL FIELD

This description discloses a technology relating to a tape feeder support plate type/component type combination verification system and a support plate type/component type combination verification method in which a support plate for supporting a component supply tape is provided on a bottom face section of a tape passage where the component supply tape passes, the system and the method being configured to verify the appropriateness of a combination of a type of the support plate and a type of components of the component supply tape.

BACKGROUND ART

In a component supply tape that is set in a tape feeder, components are accommodated in component accommodation recessed sections formed at equal intervals in a carrier tape, and a top tape (a top film) is caused to adhere to an upper face of the carrier tape. The tape feeder is such that the component supply tape is pitch fed towards a component pickup position, the top tape is peeled off just before the component suction position so as to expose subsequently the components accommodated in the individual component accommodation recessed sections while the component supply tape continues to be fed towards the component suction position, and the components are picked up through suction by a suction nozzle of a component mounting machine to be mounted on a circuit board.

During operation of the tape feeder, there is a possibility that the components in the component accommodation recessed sections in the component supply tape are caused to deviate, inclined, or caused to move out from their proper positions by vibration, impact, or static electricity caused by the pitch feeding operation of the component supply tape or the peeling off operation of the top tape, which causes the occurrence of an abnormal suction by the suction nozzle such as a component suction error (a suction failure) or an oblique suction.

To cope with this problem, there is proposed a configuration as described in Patent Literature 1 (JP-A-2007-27246), in which a support plate having a magnet attached thereto is attached to a bottom face section of a tape passage of a tape feeder so as to prevent components in component accommodation recessed sections from being caused to deviate, inclined, or caused to move out from their proper positions by attracting the components to bottom face sides of the component accommodation recessed sections of a component supply tape by virtue of a magnetic attraction force of the magnet.

PATENT LITERATURE

Patent Literature 1: JP-A-2007-27246

BRIEF SUMMARY

Technical Problem

Although depending on the types of the components accommodated in the component supply tape, there are components which are not affected in any way even when magnetism is applied to them, components which are vulnerable to magnetism, and components which are not affected to such an extent that a problem is caused when magnetism is applied to them, provided that the magnetism applied is weak but are vulnerable to strong magnetism, which should not then be applied to them. Consequently, as to the support plate attached to the bottom face section of the tape passage of the tape feeder, it is desirable that support plates having different magnitudes of magnetism can be exchanged according to types of components accommodated in components supply tapes for use. In the case that support plates cannot be exchanged, tape feeders to which support plates having different magnitudes of magnetism need to be prepared from which a tape feeder is selected for exchange which has attached thereto a support plate matching a type of components of a component supply tape in use.

Consequently, when setting a component supply tape in a tape feeder, the operator needs to visually verify the appropriateness of a combination of a type of components accommodated in the component supply tape and a type of a support plate of the tape feeder.

However, since it is hard for the operator to visualize the type of the support plate attached to the tape feeder for verifying, there is a possibility that a human error occurs in which the operator sets the component supply tape in the tape feeder without the operator noticing a wrong combination. As a result, there has been a possibility that the production is started with such a wrong combination, whereby an abnormal suction of the suction nozzle such as a component suction error or an oblique suction is caused, or a component vulnerable to magnetism is damaged by the magnetism of the support plate.

Solution to Problem

In order to solve the problems described above, according to the present disclosure, there is provided a tape feeder support plate type/component type combination verification system that is used for the tape feeder in which a support plate for supporting a component supply tape is provided on a bottom face section of a tape passage through which the component supply tape passes, and that is configured to verify appropriateness of a combination of a type of the support plate and a type of components of the component supply tape, the tape feeder support plate type and component type combination verification system comprising: a support plate type information acquisition section configured to acquire information on a type of the support plate provided in the tape feeder; a component type information acquisition section configured to acquire information on a type of components of the component supply tape; a combination determination section configured to determine appropriateness of a combination of the type of the support plate acquired by the support plate type information acquisition section and the type of the components of the component supply tape acquired by the component type information acquisition section; and a determination result output section configured to output a message, corresponding to a determination result of the appropriateness of the combination determined by the combination determination section, to at least one of a display device, an audio device, and a mobile terminal.

In this configuration, since the information on the type of the support plate attached to the tape feeder is acquired by the support plate type information acquisition section, while the information on the type of the components of the component supply tape is acquired by the component type information acquisition section, the appropriateness of the combination of the type of the support plate and the type of the components of the component supply tape is determined by the combination determination section, and the message corresponding to the determination result of the appropriateness of the combination is outputted to at least one of the display device, the audio device, and the mobile terminal, the operator can receive the message corresponding to the determination result of the appropriateness of the combination from the display, the voice, or the mobile terminal, thereby making it possible to prevent in advance the occurrence of a human error in which the operator starts the production without noticing an erroneous combination.

DESCRIPTION OF EMBODIMENTS

Hereinafter, an embodiment will be described. Firstly, a configuration of feeder setting workbench 11 will be described based on FIGS. 1 and 2.

Figure 1:
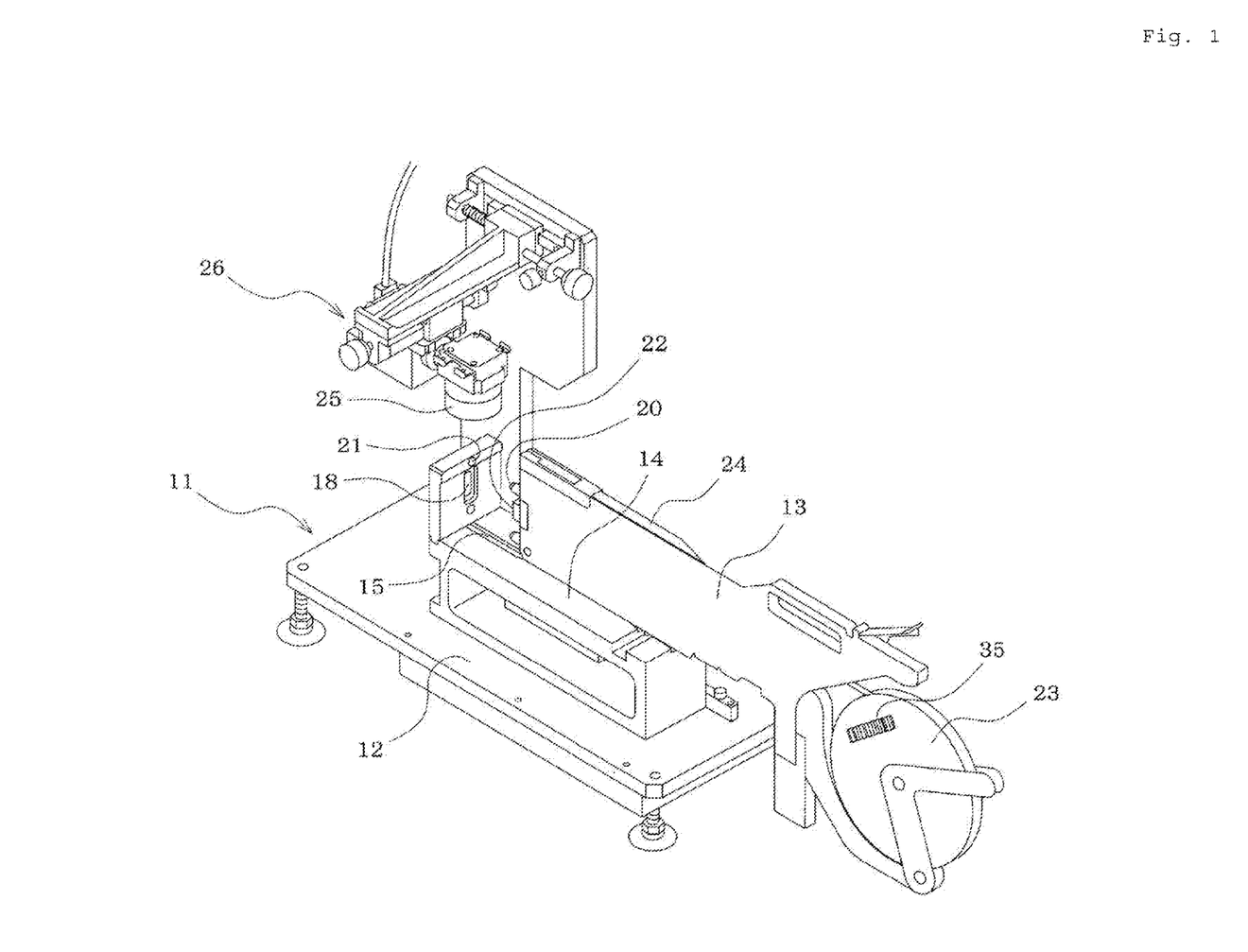
FIG. 1 is a perspective view illustrating work of mounting a tape feeder on a feeder setting workbench according to an embodiment.
Figure 2:
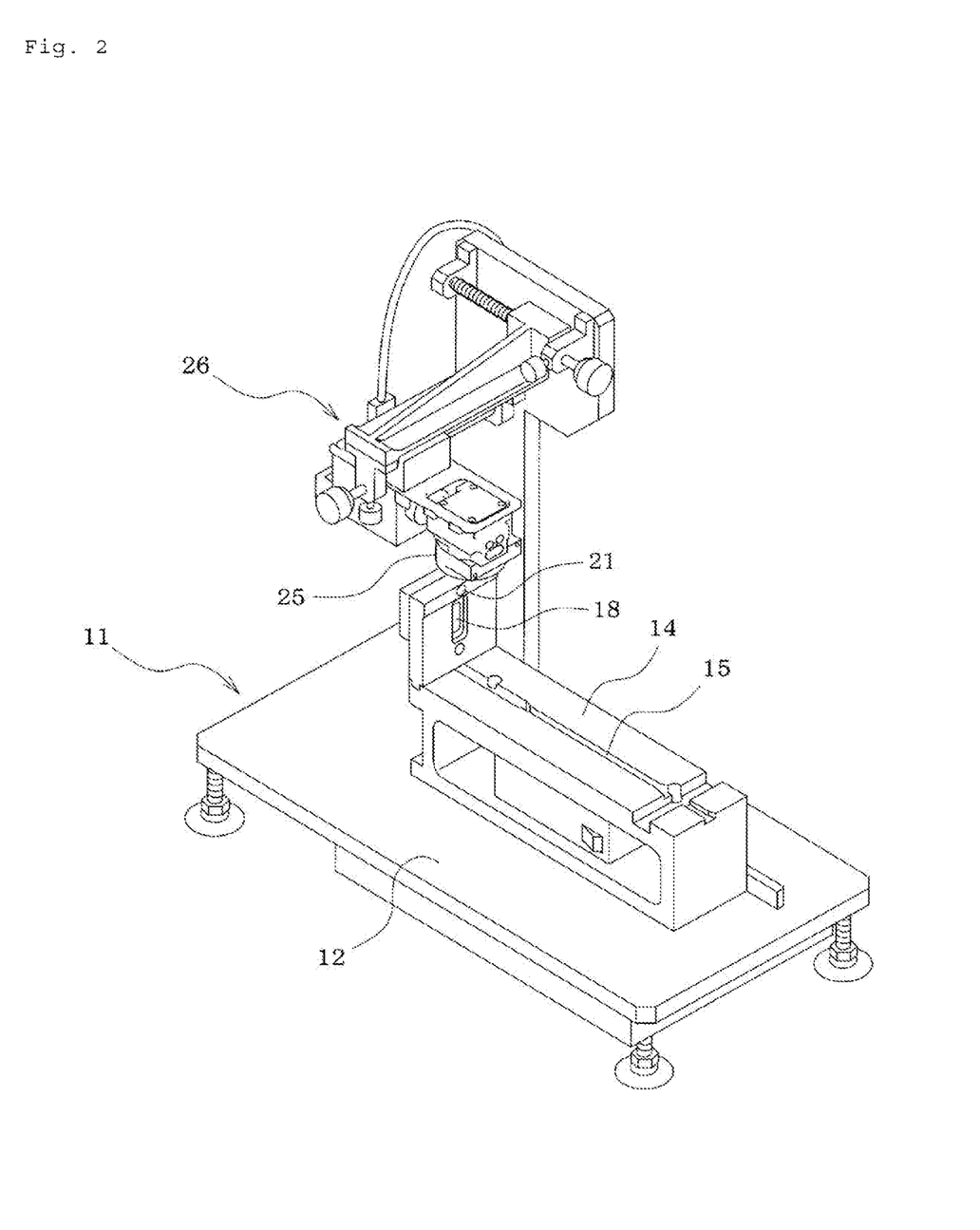
FIG. 2 is a perspective view of the feeder setting workbench.

Feeder mounting table 14, on which tape feeder 13 is mounted, is provided on an upper face of base plate 12 of feeder setting workbench 11. Guide groove 15, which has an inverted T-like groove shape in section, is provided on an upper face of feeder mounting table 14 to support tape feeder 13 placed to stand vertically, and tape feeder 13 is supported in a vertically standing state on feeder mounting table 14 by inserting a guide rail (not shown), which has an inverted T-like shape in section, provided on a lower face side of tape feeder 13 into guide groove 15 from an end lying nearer to the viewer. Further, positioning pin 20 on an end face of tape feeder 13 is inserted into positioning hole 21 in feeder mounting table 14, whereby a setting position of tape feeder 13 is positioned on feeder mounting table 14, and connector 22 on the end face of tape feeder 13 is inserted into connector 18 in feeder mounting table 14 to be connected therewith, whereby a power supply is given to tape feeder 13. As a result, when the operator operates a tape feed operating section of tape feeder 13, component supply tape 24 is pulled out from tape reel 23 set in tape feeder 13 so as to be pitch fed to a component suction position. Connector 18 of feeder setting workbench 11 is connected to computer 31, which will be described later, and computer 31, which will be described later, can communicate with control section 41 of tape feeder 13 for mutual communication by inserting connector 22 on tape feeder 13 into connector 18 in feeder setting workbench 11 for connection therewith.

Feeder setting workbench 11 includes camera 25 configured to image a component accommodating portion, situated at the component suction position, of component supply tape 24 set in tape feeder 13 mounted on feeder mounting table 14 on feeder setting workbench 11 (a portion of component supply tape 24 where the cover tape is peeled off to expose a component accommodated therein) or a fiducial mark on an upper end face of tape feeder 13 from above. XY slider 26 is provided on feeder setting workbench 11 to move camera 25 in X and Y directions (a front-rear and left-right directions), and camera 25 is supported on this XY slider 26 in such a manner as to be directed downwards. This XY slider 26 is made up of a feeding screw mechanism or the like, and its moving amounts in the X and Y directions may be controlled manually by the operator or may be controlled mechanically by being driven by a motor.

Figure 5:
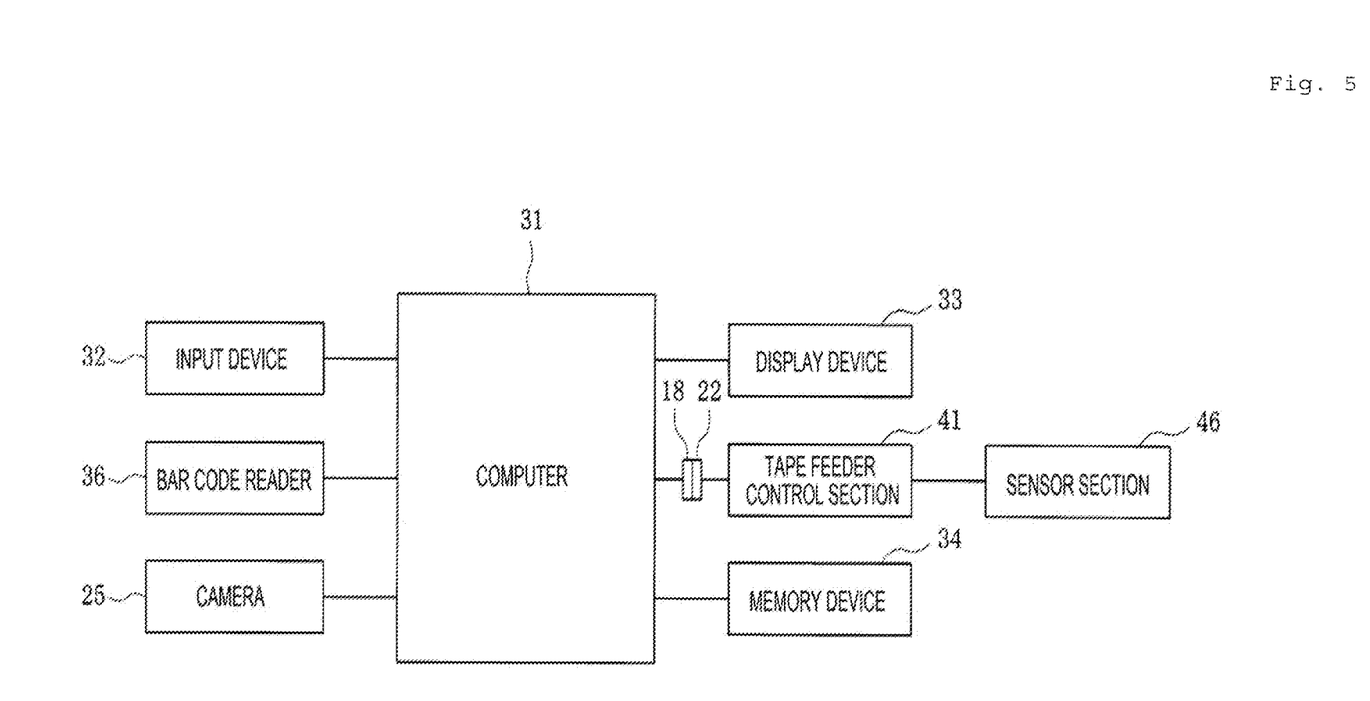
FIG. 5 is a block diagram showing a configuration of a tape feeder support plate type/component type combination verification system attached to the feeder setting workbench.

An image captured by camera 25 is transferred to computer 31 (refer to FIG. 5). Computer 31 processes the image that it receives to verify a set state of component supply tape 24 in tape feeder 13 or recognize the position of the fiducial mark on the upper end face of tape feeder 13 through image recognition to thereby determine whether tape feeder 13 is adjusted properly. As shown in FIG. 5, input device 32 such as a keyboard, a mouse, a touch panel, or the like, display device 33 for displaying thereon various types of information, memory device 34 such as a hard disk device or the like for memorizing various types of programs or data, bar code reader 36 for reading a bar code on bar code label 35 (component identification information reading section) affixed to tape reel 23, and the like are connected to computer 31.

Component identification information (hereinafter, referred to as a "component ID") identifying a type of components accommodated in component supply tape 24 wound around tape reel 23 is recorded on bar code label 35 of tape reel 23 in the form a bar code. A recording method of the component ID is not limited to a bar code, and hence, the component ID may be recorded in the form of a two-dimensional code or the like. Alternatively, an electronic tag (also referred to as an RF tag, an IC tag, an electromagnetic wave tag, or a wireless tag) may be used in which data on the component ID is memorized. In the case of the electronic tag being used, a reader capable of communicating with the electronic tag only needs to be used as a component identification information reading section. The component ID read by the component identification information reading section such as bar code reader 36 or the like is transferred to computer 31. Computer 31 recognizes the type of components accommodated in component supply tape 24 wound around tape reel 23 based on the component ID that it receives.

Figure 3:
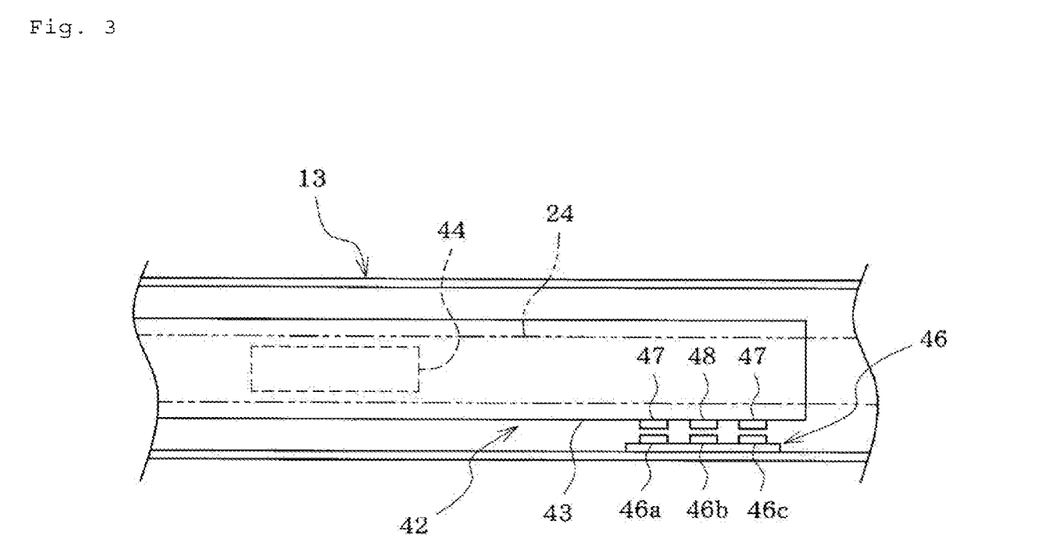
FIG. 3 is a plan view showing a configuration for detecting a type of a support plate attached to an upper face side portion of the tape feeder.
Figure 4:
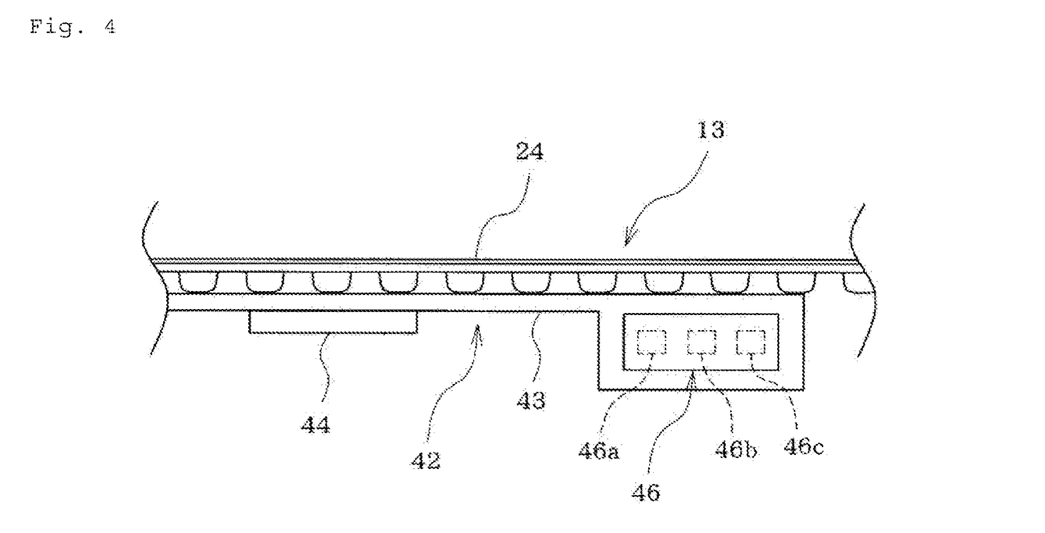
FIG. 4 is a side view showing the configuration for detecting the type of the support plate attached to the upper face side portion of the tape feeder.

As shown in FIGS. 3 and 4, support plate 43, which is configured to support component supply tape 24, is attached to a bottom face section of tape passage 42 where component supply tape 24 passes in an exchangeable (replaceable) manner in an upper face side portion of tape feeder 13. A means for attaching this support plate 43 to the bottom face section of tape passage 42 in the exchangeable manner may be any means including a screw, an engaging means, a clamp mechanism, and the like. Support plate 43 is formed of a magnetic material such as iron or the like or a non-magnetic material such as resin or the like, and a magnet 44 is provided on a lower face side of support plate 43 to apply a magnetic attraction force to components accommodated in component supply tape 24. Tape feeder 13 is configured so that one support plate is selected from multiple support plates having different magnetic properties such as magnetic attraction force or the like relative to components accommodated in component supply tapes 24 and is then attached to tape feeder 13 in the exchangeable manner. Further, a support plate, which is configured to apply no magnetic attraction force to components in component supply tapes 24, (that is, a support plate having no magnet 44) can also be attached to tape feeder 13.

Sensor section 46, which is configured to output different signals to match the types of support plates 43, is provided on tape feeder 13. Sensor section 46 is configured to detect a type of support plate 43 by use, for example, of multiple infrared sensors 46a to 46c of an infrared radiation reflection type. Specifically speaking, infrared radiation reflecting section 47 configured to reflect an infrared radiation irradiated individually from infrared sensors 46a to 46c or infrared radiation non-reflecting section 48 configured not to reflect infrared radiation so irradiated is provided at a portion on support plate 43 which faces each of multiple infrared sensors 46a to 46c. The infrared sensor (46a, 46c in the example shown in FIG. 3) facing infrared radiation reflecting section 47 detects infrared radiation reflecting section 47 by detecting infrared radiation reflected by infrared radiation reflecting section 47. On the other hand, the infrared sensor (46b in the example shown in FIG. 3) facing infrared radiation non-reflecting section 48 does not detect infrared radiation non-reflecting section 48 since infrared radiation irradiated is not reflected by infrared radiation non-reflecting section 48.

A combination of infrared radiation reflecting section 47 and infrared radiation non-reflecting section 48 which are provided on support plate 43 is changed according to a type of support plate 43. As a result, a type of support plate 43 can be detected based on the numbers and positions of infrared radiation reflecting sections 47 detected by multiple infrared sensors 46a to 46c (in other words, a combination of infrared radiation reflecting section 47 and infrared radiation non-reflecting section 48). Control section 41 of tape feeder 13 transfers an output signal of sensor section 46 (output signals of multiple infrared sensors 46a to 46c) which differs according to a type of support plate 43 to computer 31.

Sensor section 46 may use a non-contact type sensor such as a photoelectric sensor, a proximity sensor, a magnetic sensor, or the like in place of infrared sensors 46a to 46c. In the case of a photoelectric sensor or a proximity sensor being used, they may be configured in the same way as with infrared sensors 46a to 46c. In addition, in the case of a magnetic sensor being used, a configuration only needs to be adopted in which the magnetic sensor detects a magnetic field generated from support plate 43 (magnet 44) to thereby detect a type of support plate 43 in question based on the intensity of the magnetic field so detected. Alternatively, in addition to the non-contact type sensor, a switch such as a microswitch or a contact type sensor such as a contact type displacement sensor instead of the non-contact type sensor, switches such as a micro switch or the like, or a contact type sensor such as a contact type displacement sensor or the like may be used. For example, a configuration may be adopted in which multiple switches such as microswitches or the like are provided on tape feeder 13 so that the number and position of the switches brought into contact with support plate 43 to thereby be switched on are changed according to a type of support plate 43, whereby a type of support plate 43 is detected based on the number and position of the switches that are switched on. In addition, in the case of a contact type displacement sensor being used, a configuration may be adopted in which a detected displacement amount of the contact type displacement sensor brought into contact with support plate 43 is changed according to a type of support plate 43, whereby a type of support plate 43 is detected based on the detected displacement amount of the contact type displacement sensor.

A database, in which data on appropriate combinations of types of support plates 43 and types of components in component supply tapes 24 are accumulated, is stored in memory device 34 of computer 31. Computer 31 functions not only as a support plate type information acquisition section configured to recognize a type of support plate 43 attached to tape feeder 13 based on an output signal of sensor section 46 which is transferred from control section 41 of tape feeder 13 but also as a component type information acquisition section configured to recognize a type of components accommodated in component supply tape 24 wound around tape reel 23 by fetching the component ID read by the operator via bar code reader 36 by executing a support plate type and component type combination verification program shown in FIGS. 6 and 7. Further, computer 31 not only functions as a combination determination section configured to determine based on the database whether a combination of the type of support plate 43 and the type of component supply tape 24, which are recognized as described above, is appropriate but also as a determination result output section configured to display a message corresponding to the determination result on display device 33 or inform the message in the form of voice by an audio device (not shown). Alternatively, a message corresponding to a determination result may be displayed on a mobile terminal carried by the operator, or the operator may be informed of the message in the form of voice from the mobile terminal.

Figure 6:
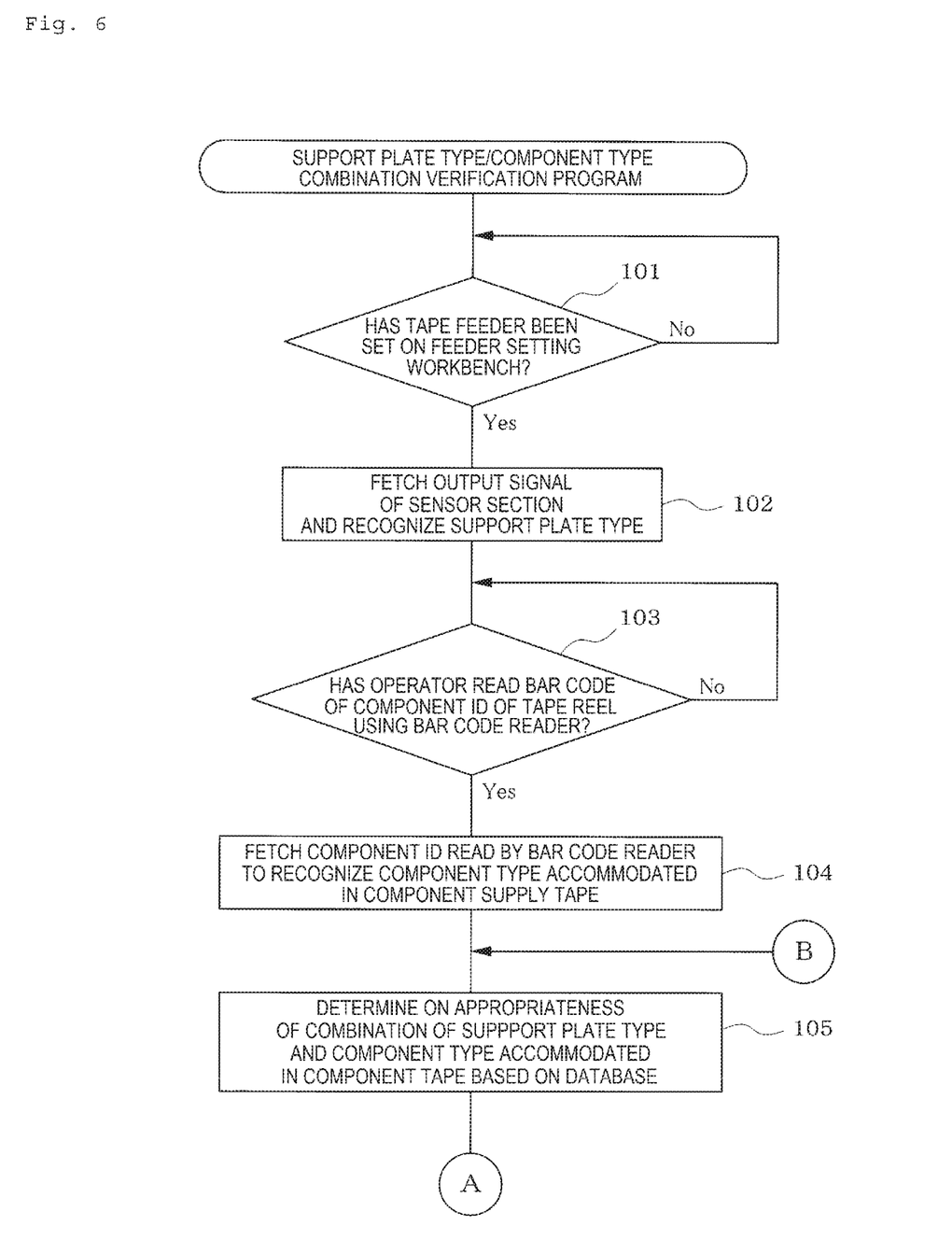
FIG. 6 is a flowchart showing a flow of processing operations of a first half portion of a support plate type and component type combination verification program.
Figure 7:
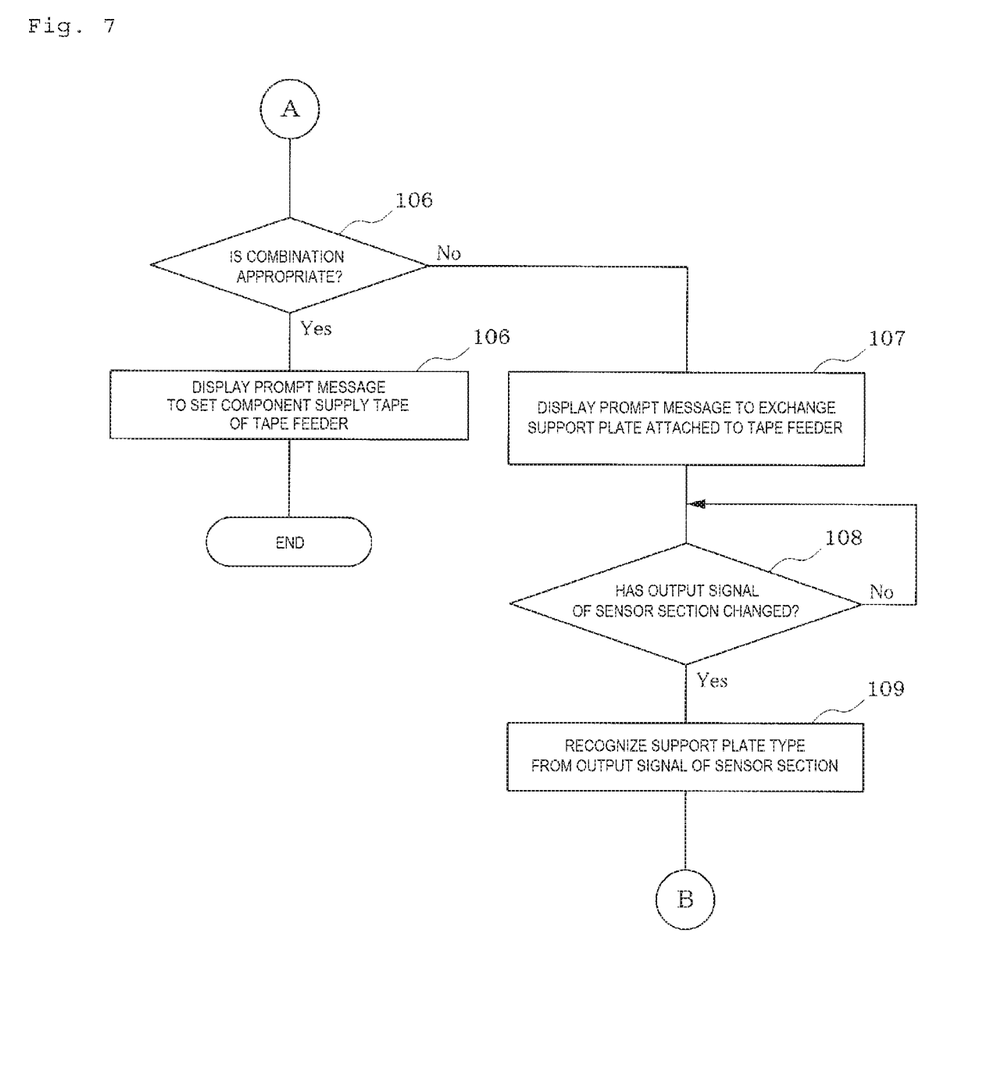
FIG. 7 is a flowchart showing a flow of processing operations in a second half portion of the support plate type and component type combination verification program.

The determination on appropriateness of the combination of the type of support plate 43 and the type of components accommodated in component supply tape 24 according to the embodiment described heretofore is executed by computer 31 in accordance with the support plate type and component type combination verification program shown in FIGS. 6 and 7. Hereinafter, processing details of the support plate type and component type combination verification program shown in FIGS. 6 and 7 will be described.

When the support plate type and component type combination verification program shown in FIGS. 6 and 7 is activated, firstly, computer 31 determines in step 101 whether the operator sets tape feeder 13 on feeder setting workbench 11 by determining whether computer 31 can communicate with control section 41 of tape feeder 13 as a result of connector 22 of tape feeder 13 being inserted into connector 18 on feeder setting workbench 11 for connection therewith. If tape feeder 13 is not set on feeder setting workbench 11, computer 31 waits until the operator sets tape feeder 13 on feeder setting workbench 11.

Thereafter, the program proceeds to step 102 at a point in time when the operator sets tape feeder 13 on feeder setting workbench 11 whereby computer 31 can communicate with control section 41 of tape feeder 13, and computer 31 fetches an output signal of sensor section 46 which is transferred from control section 41 of tape feeder 13 and recognizes a type of support plate 43 attached to tape feeder 13.

Thereafter, the program proceeds to step 103, where computer 31 determines whether the operator has read the bar code of the component ID from bar code label 35 of tape reel 23 which the operator is setting on tape feeder 13 using bar code reader 36 (that is, the information into which the component ID of tape reel 23 is read has been transferred from bar code reader 36 to computer 31), and if the bar code of the component ID has not yet been read by bar code reader 36, computer 31 waits until the operator reads the bar code of the component ID of tape reel 23 using bar code reader 36. Thereafter, the program proceeds to step 104 at a point in time when the operator reads the bar code of the component ID of tape reel 23 using bar code reader 36, where computer 31 fetches the component ID of tape reel 23 that bar code reader 36 reads to thereby recognize a type of components accommodated in component supply tape 24 wound around tape reel 23.

The processing operations in steps 101 to 102 (the processing operations of recognizing the type of support plate 43) and the processing operations in steps 103 to 104 (the processing operations of recognizing the type of the components accommodated in component supply tape 24) may be performed in a reverse order, so that the type of support plate 43 may be recognized after the type of the components accommodated in component supply tape 24 is recognized first.

After the type of support plate 43 and the type of the components accommodated in component supply tape 24 are recognized in the ways described above, the program proceeds to step 105, where the appropriateness of a combination of the type of support plate 43 and the type of the components accommodated in component supply tape 24, which are recognized in steps 102 and 104, respectively, is determined by referring to the database, which is stored in memory device 34, where data on appropriate combinations of types of support plates 43 and types of components accommodated in component supply tapes 24 are accumulated. As a result, if it is determined in step 106 shown in FIG. 7 that the combination is appropriate, the program proceeds to step 110, where a message prompting setting of component supply tape 24 in tape feeder 13 is displayed on display device 33 or a mobile terminal or the operator is informed to that respect in the form of voice.

In contrast to this, if it is determined in step 106 described above that the combination of the type of support plate 43 and the type of component supply tape 24 is not appropriate (that is, wrong), the program proceeds to step 107, where a message prompting an exchange of support plate 43 attached to tape feeder 13 is displayed on display device 33 or the mobile terminal, or the operator is informed to that respect in the form of voice.

Thereafter, the program proceeds to step 108, where whether support plate 43 attached to tape feeder 13 has been exchanged is determined by determining whether the output signal of sensor section 46 has changed, and computer 31 waits until the output signal of sensor section 46 changes. Thereafter, the program proceeds to step 109 by determining that support plate 43 attached to tape feeder 13 has been exchanged at a point in time when the output signal of sensor section 46 has changed, to thereby recognize a type of support plate 43 which is now attached to tape feeder 13 from an output signal from sensor section 46. Thereafter, returning to step 105 shown in FIG. 6 described above, the appropriateness of the type of support plate 43 and the type of the components accommodated in component supply tape 24 is determined again. Thereafter, the processing operations in step 106 described above onwards are performed again, and finally, the program proceeds to step 110 at a stage where the combination of the type of support plate 43 and the type of the components accommodated in component supply tape 24 is determined appropriate in step 106, and a message prompting setting component supply tape 24 in tape feeder 13 is displayed on display device 33 or the mobile terminal, or the operator is informed to that respect in the form of voice.

In the support plate type and component type combination verification program shown in FIGS. 6 and 7, while the operator reads the bar code of the component ID of tape reel 23 using bar code reader 36 before the operator sets tape reel 23 (component supply tape 24) in tape feeder 13, the operator may read the bar code of the component ID of tape reel 23 using bar code reader 36 after the operator sets tape reel 23 in tape feeder 13. In this case, the operator may read the bar code of the component ID of tape reel 23 set in tape feeder 13 using bar code reader 36 before the operator sets tape feeder 13 on feeder setting workbench 11 or the operator may read the bar code of the component ID of tape reel 23 set in tape feeder 13 using bar code reader 36 after the operator sets tape feeder 13 on feeder setting workbench 11.

corresponding to the present embodiment that has been described heretofore, the information on the type of support plate 43 attached to tape feeder 13 is acquired from the output signal of sensor section 46, and the information on the type of components accommodated in component supply tape 24 is acquired using bar code reader 36, so that the appropriateness of the combination of the type of support plate 43 and the type of the components accommodated in component supply tape 24 is determined, and the message corresponding to the determination result of the appropriateness of the combination is displayed on display device 33 or the mobile terminal or is delivered in the form of voice so as to inform the operator to that respect, whereby the operator can receive the message corresponding to the determination result by seeing the display or being informed by voice. As a result, a human error can be prevented in advance in which the operator starts the production without noticing an erroneous combination, whereby not only can abnormal suction by the suction nozzle that would be caused by the human error, if any, be prevented in advance, the abnormal suction including a component suction error, an oblique suction, or the like, but also components vulnerable to magnetism can be prevented in advance from being damaged by the magnetism of support plate 43.

In the present embodiment, while the type of support plate 43 attached to tape feeder 13 is detected by sensor section 46, a configuration may be adopted in which for example, a support plate identification information recording section, in which support plate identification information identifying a type of support plate 43 is recorded or memorized, is provided at an exposed portion on the upper face of support plate 43, and a support plate identification information reading section, which is configured to read the support plate identification information from the support plate identification information recording section, is provided, whereby the support plate identification information read at the support plate identification information reading section is transferred to computer 31. As this occurs, the support plate identification information reading section may use, for example, a reader or may be configured to read the support plate identification information by imaging the support plate identification information recording section with camera 25 provided on feeder setting workbench 11 and processing the image so captured.

In the present embodiment, while support plate 43 attached to tape feeder 13 can be exchanged, even for a tape feeder in which support plate 43 attached thereto cannot be exchanged, as with the present embodiment, the configuration may be adopted in which the appropriateness of a combination of a type of support plate 43 and a type of components accommodated in component supply tape 24 is determined. As this occurs, in the event that a combination of a type of support plate 43 and a type of components accommodated in component supply tape 24 is determined wrong, the operator only needs to exchange the tape feeder in question. In the case of the tape feeder in which support plate 43 cannot be exchanged, a configuration only needs to be adopted in which support plate identification information is included in feeder identification information which identifies a tape feeder, and the feeder identification information is memorized in a non-volatile memory of a control section of the tape feeder, whereby when the tape feeder is set on feeder setting workbench 11, computer 31 reads the feeder identification information including the support plate identification information from the control section of the tape feeder so as to acquire information on the type of the support plate.

Further, in the present embodiment, while the message prompting the set of component supply tape 24 into tape feeder 13 or the message prompting the exchange of support plate 43 is described as being displayed on display device 33 or the like as the message corresponding to the determination result of the appropriateness of the combination of the type of support plate 43 and the type of the components accommodated in component supply tape 24, the message corresponding to the determination result of the appropriateness of the combination can be changed variously, and then, for example, the determination result of the appropriateness of the combination may be displayed as it is on display device 33 or the like as the message.

In addition, the present disclosure is not limited to the embodiment that has been described heretofore, and hence, needless to say, the embodiment may be modified variously without departing from the spirit thereof, and hence, for example, the configuration of support plate 43 may be modified, or the configuration of feeder setting workbench 11 may be modified.

REFERENCE SIGNS LIST

11 Feeder setting workbench, 13 Tape feeder, 18 Connector, 22 Connector, 23 Tape reel, 24 Component supply tape, 25 Camera, 31 Computer (Support plate type information acquisition section, Component type information acquisition section, Combination determination section, Determination result output section), 33 Display device, 35 Bar code label (Component identification information recording section), 36 Bar code reader (Component identification information reading section), 41 Control section of Tape feeder, 42 Tape passage, 43 Support plate, 44 Magnet, 46 Sensor section, 46a to 46c, Infrared sensor, 47 Infrared radiation reflecting section, 48 Infrared radiation non-reflecting section.

The invention claimed is:

1. A tape feeder support plate type/component type combination verification system that is used for the tape feeder in which a support plate for supporting a component supply tape is provided on a bottom face section of a tape passage through which the component supply tape passes, and that is configured to verify appropriateness of a combination of a type of the support plate and a type of components of the component supply tape, the tape feeder support plate type and component type combination verification system comprising:

a support plate type information acquisition section configured to acquire information on a type of the support plate provided in the tape feeder;

a component type information acquisition section configured to acquire information on a type of components of the component supply tape;

a combination determination section configured to determine appropriateness of a combination of the type of the support plate acquired by the support plate type information acquisition section and the type of the components of the component supply tape acquired by the component type information acquisition section; and a determination result output section configured to output a message, corresponding to a determination result of the appropriateness of the combination determined by the combination determination section, to at least one of a display device, an audio device, and a mobile terminal.

2. The tape feeder support plate type/component type combination verification system according to claim 1, wherein the tape feeder is configured that a support plate capable of applying a predetermined magnetic attraction force to the components of the component supply tape and a support plate without applying a predetermined magnetic attraction force to the components of the component supply tape are attached to the tape feeder in an exchangeable manner.

3. The tape feeder support plate type/component type combination verification system according to claim 1, wherein the tape feeder is configured that a support plate is selected from multiple support plates having different magnetic properties relative to components of the component supply tape and is attached to the tape feeder in an exchangeable manner.

4. The tape feeder support plate type/component type combination verification system according to claim 1,
wherein a sensor section is provided in the tape feeder, the sensor section being configured to output a different signal according to a type of the support plate, and
wherein the support plate type information acquisition section acquires a signal outputted from the sensor section to thereby acquire information on a type of the support plate.

5. The tape feeder support plate type/component type combination verification system according to claim 1,
wherein a component identification information recording section, being provided on a tape reel around which the component supply tape is wound, which records or memorizes a component identification information to identify a type of components of the component supply tape,
wherein a component identification information reading section is provided, the component identification information reading section being configured to read the component identification information from the component identification information recording section of the tape reel, and
wherein the component type information acquisition section acquires the component identification information read at the component identification information reading section to thereby acquire information on a type of the components of the component supply tape.

6. The tape feeder support plate type/component type combination verification system according to claim 1, further comprising a feeder setting workbench on which the tape feeder is mounted in performing work of setting the component supply tape in the tape feeder, wherein the feeder setting workbench further comprises a connector configured to supply power to and communicate with the tape feeder, and a computer configured to communicate with the tape feeder connected to the connector, and wherein the computer serves as the support plate type information acquisition section, the component type information acquisition section, the combination determination section, and the determination result output section.

7. The tape feeder support plate type/component type combination verification system according to claim 6, wherein the computer communicates with the tape feeder when the tape feeder is set on the feeder setting workbench to thereby acquire a type of the support plate.

8. The tape feeder support plate type/component type combination verification system according to claim 6, wherein the computer comprises a database where data on appropriate combinations of types of the support plates and types of components of the component supply tapes are accumulated, and determines the appropriateness of a combination of the type of the support plate acquired at the support plate type information acquisition section and the type of the components of the component supply tape acquired the component type information acquisition section by referring to the data of the database.

9. A tape feeder support plate type/component type combination verification method that is used for the tape feeder in which a support plate for supporting a component supply tape is provided on a bottom face section of a tape passage through which the component supply tape passes, and that is configured to verify appropriateness of a combination of a type of the support plate and a type of components of the component supply tape, the tape feeder support plate type and component type combination verification method comprising:

a support plate type information acquisition step of acquiring information on a type of the support plate provided in the tape feeder;

a component type information acquisition step of acquiring information on a type of components of the component supply tape;

a combination determination step of determining appropriateness of a combination of the type of the support plate acquired at the support plate type information acquisition step and the type of the components of the component supply tape acquired at the component type information acquisition step; and a determination result output step of outputting a message corresponding to a determination result of the appropriateness of the combination determined at the combination determination step to at least one of a display device, an audio device, and a mobile terminal.

* * * * *